(12) United States Patent
Katoch

(10) Patent No.: US 12,190,944 B2
(45) Date of Patent: Jan. 7, 2025

(54) MEMORY DEVICE WITH SIGNAL EDGE SHARPENER CIRCUITRY

(71) Applicant: Taiwan Semiconductor Manufacturing Company, Ltd., Hsinchu (TW)

(72) Inventor: Atul Katoch, Kanata (CA)

(73) Assignee: Taiwain Semiconductor Manufacturing Company, Ltd., Hsinchu (TW)

( * ) Notice: Subject to any disclaimer, the term of this patent is extended or adjusted under 35 U.S.C. 154(b) by 325 days.

(21) Appl. No.: 17/234,160

(22) Filed: Apr. 19, 2021

(65) Prior Publication Data

US 2021/0241825 A1    Aug. 5, 2021

Related U.S. Application Data

(62) Division of application No. 16/589,971, filed on Oct. 1, 2019, now Pat. No. 10,984,854.

(51) Int. Cl.
  *G11C 11/418*    (2006.01)
  *G11C 11/417*    (2006.01)

(52) U.S. Cl.
  CPC .......... *G11C 11/418* (2013.01); *G11C 11/417* (2013.01)

(58) Field of Classification Search
  CPC .............................. G11C 11/418; G11C 11/419
  USPC ..................................... 365/230.06
  See application file for complete search history.

(56) References Cited

U.S. PATENT DOCUMENTS

| | | |
|---|---|---|
| 5,239,237 A | 8/1993 | Tran et al. |
| 6,741,504 B2 | 5/2004 | Van De Graaff |
| 10,984,854 B1 | 4/2021 | Katoch |
| 2001/0014002 A1 | 8/2001 | Hidaka |
| 2003/0058717 A1 | 3/2003 | Kawamoto et al. |
| 2004/0013005 A1 | 1/2004 | Van De Graaff |
| 2006/0140033 A1 | 6/2006 | Crippa et al. |
| 2007/0159909 A1* | 7/2007 | Frederick ................. G11C 5/14 365/228 |
| 2011/0090750 A1* | 4/2011 | Arsovski ................ G11C 7/222 365/194 |
| 2012/0075918 A1* | 3/2012 | Arsovski .................. G11C 8/08 365/230.06 |
| 2013/0051128 A1* | 2/2013 | Lu ......................... G11C 11/413 327/263 |
| 2019/0221256 A1* | 7/2019 | Kumar ................... H10B 10/12 |

FOREIGN PATENT DOCUMENTS

| | | |
|---|---|---|
| CN | 106531209 A | 3/2017 |
| KR | 10-2015-0120140 A | 10/2015 |
| WO | 2019/108402 A1 | 6/2019 |

* cited by examiner

*Primary Examiner* — Sung Il Cho
(74) *Attorney, Agent, or Firm* — Merchant & Gould P.C.

(57) ABSTRACT

Signal edge sharpener circuitry is operably connected to the word lines in a memory array to pull up a rising edge of a signal on the word line and/or to pull down a falling edge of the signal on the word line. Pulling the signal up and/or down reduces the amount of time the word line is asserted and reduces the amount of time between precharge operations.

20 Claims, 11 Drawing Sheets

MEMORY DEVICE WITH SIGNAL EDGE SHARPENER CIRCUITRY

CROSS-REFERENCE TO RELATED APPLICATIONS

This application is a divisional application of U.S. patent application Ser. No. 16/589,971, now U.S. Pat. No. 10,984,854, titled "Memory Device with Signal Edge Sharpener Circuitry" filed on Oct. 1, 2019, the entire disclosure of which is hereby incorporated herein by reference.

BACKGROUND

Different types of memory circuits are used in electronic devices for various purposes. Read only memory (ROM) and random access memory (RAM) are two such types of memory circuits. A ROM circuit permits data to be read from, but not written to, the ROM circuit and retains its stored data when power is switched off. As such, a ROM circuit is typically used to store programs that are executed when the electronic device is turned on.

A RAM circuit allows data to be written to, and read from, selected memory cells in the RAM circuit. One type of a RAM circuit is a static random access memory (SRAM) circuit. A typical SRAM circuit includes an array of addressable memory cells arranged in columns and rows. When a memory cell is to be read, the memory cell is selected by activating both a row word line and the column signal lines (bl and blb lines) connected to the memory cell. Typically, the column signal lines are precharged prior to the performance of a read or a write operation.

Improvements in fabrication techniques for memory devices allow the memory devices to be fabricated in smaller and smaller packages. With a smaller memory device, the resistance and the capacitance of the row word lines increase due to the material used in the row word lines and the geometry of the row word lines. The resistances of the row word lines increase because the geometry of the word lines is smaller. Additionally, the row word lines are closer to each other in a smaller package, which in turn increases the capacitance of the row word lines. The increased resistances and capacitances cause the rising and/or falling edges of a signal on a row word line to require more time to reach a particular signal level (e.g., a high signal level or a low signal level). This in turn causes the amount of time between precharge operations to increase because a precharge operation cannot begin until the signal on the word line has reached the particular signal level.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
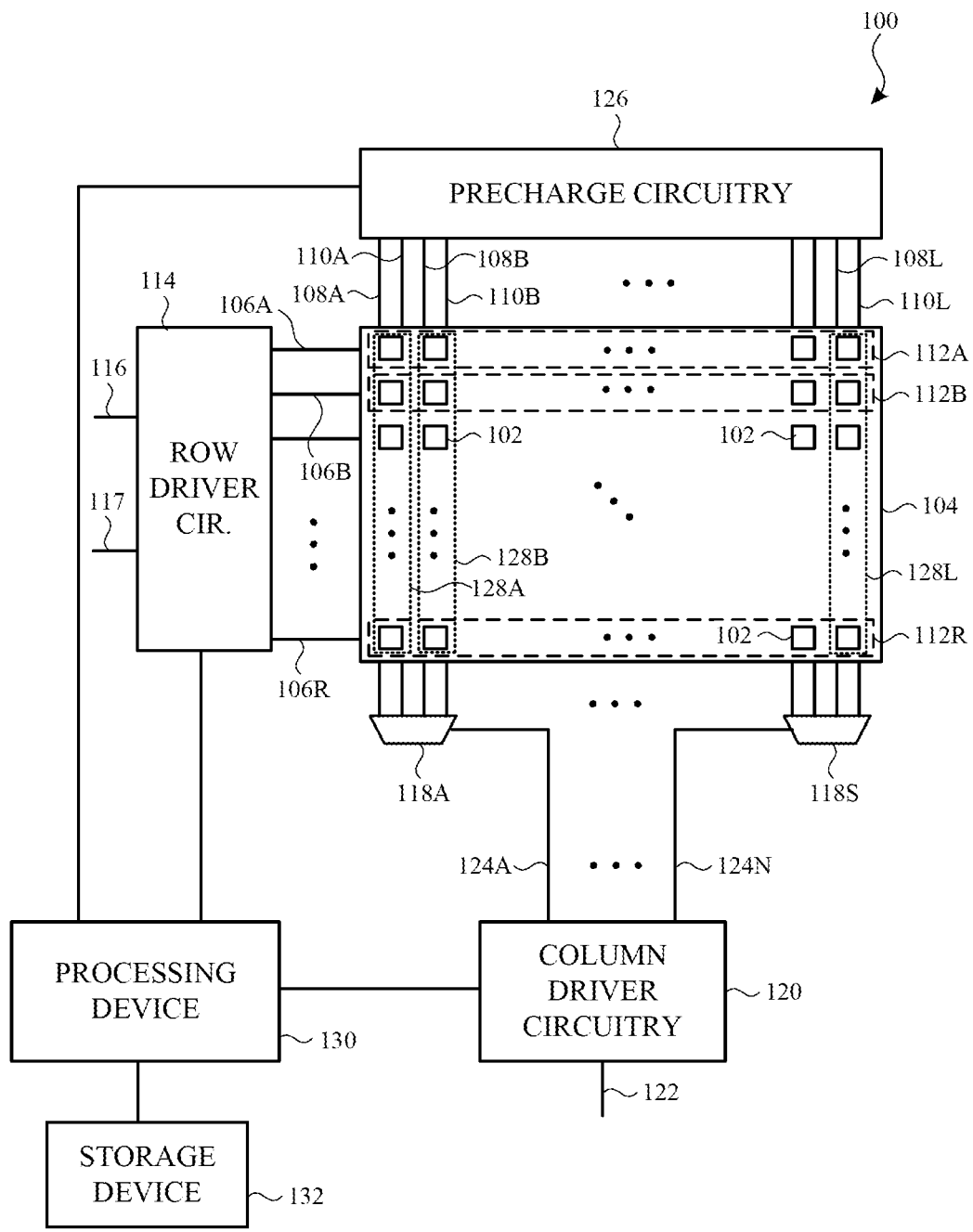
FIG. 1 illustrates a block diagram of a portion of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein provide signal edge sharpener circuitry to pull up and/or pull down a signal on a word line to cause the signal to reach a particular signal level faster (e.g., a high or a low signal level). For example, at the end of a read or a write operation, the signal edge sharpener circuitry can cause the signal on the word line to reach the particular signal level in a shorter amount of time, which in turn means a precharge operation can start sooner. Reducing the amount of time between precharge operations reduces the $T_{CYCLE}$ for the memory array. The $T_{CYCLE}$ is the amount of time used to precharge the bit lines combined with the amount of time the word line is activated. Thus, reducing the amount of time between deactivating a word line and initiating a precharge operation beneficially reduces the $T_{CYCLE}$. The precharging and read/write operations of the memory device occur in a shorter amount of time.

In embodiments disclosed herein, the signal edge sharpener circuitry is operably connected to the word lines. As such, the memory device does not need to perform any additional address decoding. In one embodiment, only one additional signal line is used to connect a delay circuit to the signal edge sharpener circuitry. Moreover, the signal edge sharpener circuitry does not significantly impact how the memory device is operated and/or is constructed.

In one embodiment, the effect of the signal edge sharpener circuitry can be tuned or customized for a particular type of a memory device. During fabrication, a small signal edge sharpener circuitry is connected to a word line and the slope of the falling or rising edge is determined. If the size of the signal edge sharpener circuitry is to be increased, additional fingers or fins are added until the slope of the falling or rising edge is at a predetermined slope.

These and other embodiments are discussed below with reference to FIGS. 1-11. However, those skilled in the art will readily appreciate that the detailed description given herein with respect to these Figures is for explanatory purposes only and should not be construed as limiting.

FIG. 1 illustrates a block diagram of a portion of a memory device in accordance with some embodiments. In the illustrated embodiment, the memory device is a static random access memory (SRAM) device 100. Other embodiments are not limited to a SRAM device. The memory device can be any memory that precharges signal lines and selects only a subset of the precharged signal lines to perform an operation (e.g., access a memory cell or cells). Additionally, FIG. 1 is described in conjunction with accessing one memory cell in a memory array. In other embodiments, multiple memory cells may be accessed at one time.

The SRAM device 100 includes memory cells 102 that are arranged in rows and columns to form a memory array 104. A memory array 104 can include any suitable number of rows and columns. For example, a memory array may have R number of rows, where R is an integer greater than or equal or one, and L number of columns where L is a number greater than or equal to two.

In the illustrated embodiment, each memory cell 102 in a row 112A, 112B, . . . , 112R is operably connected to a row word line 106A, 106B, . . . , 106R (collectively referred to as a word line 106 and row 112). Each memory cell 102 in a column 128A, 128B, . . . , 128L is operably connected to a column bit line (bl) 108A, 108B, . . . 108L, and a column bit line bar (blb) 110A, 110B, . . . , 110L (collectively referred to as bl line 108 and blb line 110 and column 128).

Each row 112 of memory cells 102 is operably connected to row driver circuitry 114 via the word lines 106. The row driver circuitry 114 receives a row address on signal line 116 and a clock signal on signal line 117 and activates the word line that corresponds to the row address. Although only one address signal line 116 and only one clock signal line 117 are depicted, embodiments can include any number of address signal lines and/or clock signal lines. Additionally, although only one row driver circuitry 114 is shown in FIG. 1, other embodiments can include multiple row driver circuitries with each row driver circuitry 114 operably connected to a subset of the word lines. Thus, the row driver circuitry 114 represents one or more row driver circuitries.

The column signal lines (bl and blb lines 108, 110) are grouped into subsets of column signal lines, and the subsets of column signal lines are operably connected to column select circuits 118A, . . . 118S, where S is a number greater than one (collectively referred to as column select circuit 118). One example of a column select circuit 118 is a multiplexer. Each column select circuit 118 is operably connected to column address circuitry 120. The column address circuitry 120 receives a column address on signal line 122 and generates a select signal on a signal line 124A, . . . , 124N (collectively referred to as signal line 124) for a respective column select circuit 118. Although only one column address circuitry 120 is shown in FIG. 1, other embodiments can include multiple column address circuits.

The column signal lines (bl and blb lines 108, 110) in the memory array 104 are operably connected to precharge circuitry 126. The precharge circuitry 126 includes one or more precharge circuits. In one embodiment, each column 128 in the memory array 104 is operably connected to a precharge circuit. The precharge circuitry 126 charges the bl and blb lines 108, 110 to particular voltage levels. For example, for a read operation, the precharge circuitry 126 charges the selected column signal lines (selected bl and blb lines 108, 110) to a first voltage level and charges the unselected bl and blb lines 108, 110 to a lower second voltage level.

One or more processing devices (represented by processing device 130) is operably connected to the row driver circuitry 114, the column address circuitry 120, and the precharge circuitry 126. The processing device 130 can be configured to control some or all of the operations of the row driver circuitry 114, the column address circuitry 120, and the precharge circuitry 126. In some instances, the processing device 130 causes the precharge circuitry 126 to precharge the selected column signal lines (bl and blb lines 108, 110) to a first voltage level and the unselected column signal lines to a different second voltage level. In some embodiments, the processing device 130 is operably connected to other components in or operably connected to the memory device, such as, for example, read and write circuitry (not shown) and/or a clock circuit (not shown).

The processing device 130 can be operably connected to one or more storage devices (represented by storage device 132). The storage device 132 can store programs, routines, and/or data that are used for some or all of the operations of the memory device. For example, the storage device 132 can store control signals, or data associated with the control signals, that are used by the row driver circuitry 114, the column address circuitry 120, and the precharge circuitry 126. The storage device 132 may comprise, but is not limited to, volatile storage (e.g., random access memory), non-volatile storage (e.g., read-only memory), flash memory, or any combination of such memories.

As will be described in more detail, signal edge sharpener circuitry is operably connected to the word lines 106 to increase the slope of a rising edge and/or a falling edge of a signal on a word line. The signal edge sharpener circuitry pulls down the falling edge of the signal on the word line and/or pulls up the rising edge of the signal on the word line. By pulling up and/or pulling down the signal on the word line, the amount of time to assert or de-assert, respectively, the word line is reduced. Reducing the amount of time to assert or de-assert the word lines allows the precharge operations on the bit lines to begin sooner.

Figure 2:
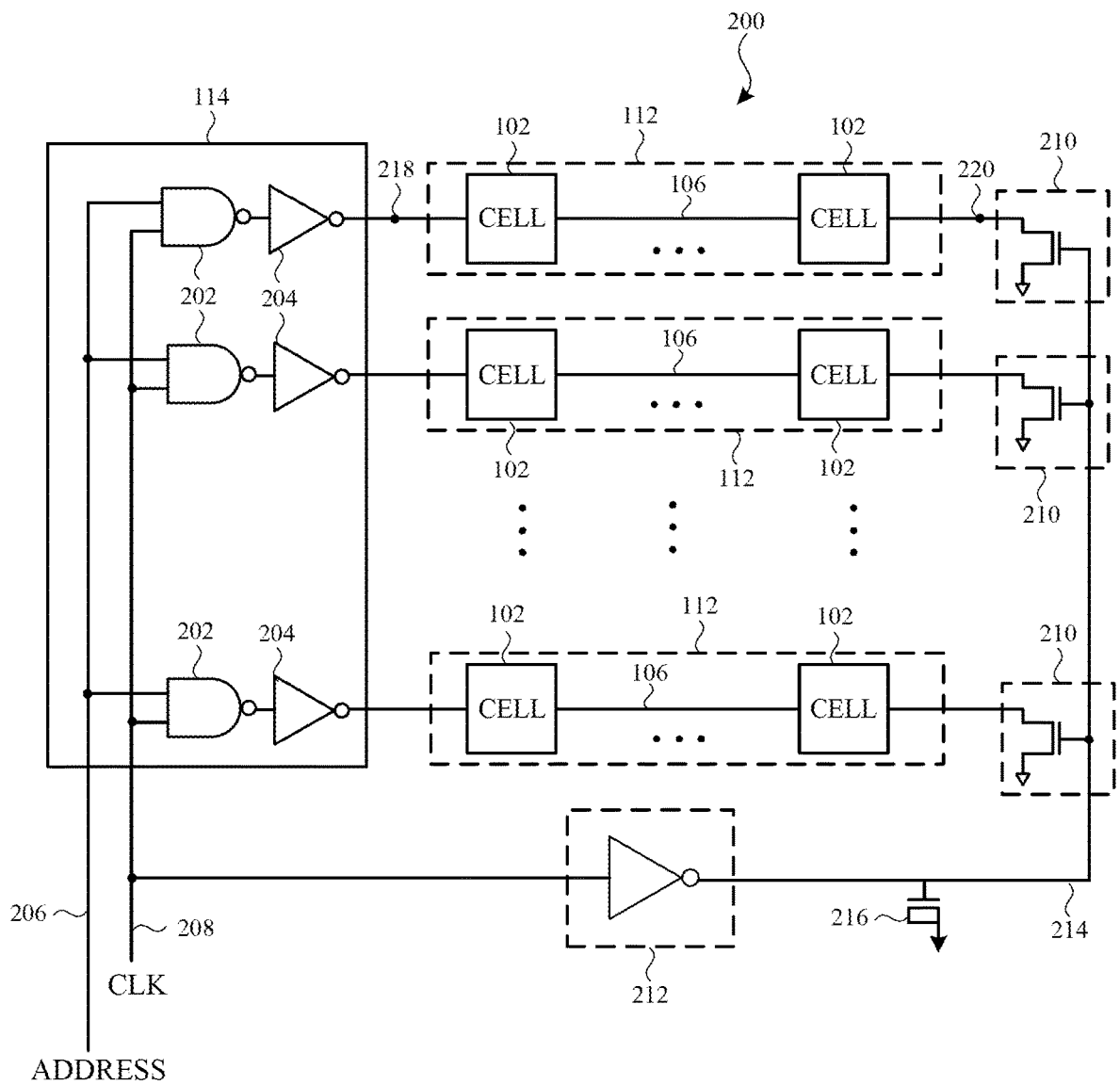
FIG. 2 depicts a block diagram of a first example memory array with signal edge sharpener circuitry in accordance with some embodiments.

FIG. 2 depicts a block diagram of a first example memory array with signal edge sharpener circuitry in accordance with some embodiments. Only a portion of the memory array 200 is shown. The embodiment shown in FIG. 2 is configured to pull down the falling edge of a signal on one or more asserted word lines.

As described earlier, each memory cell 102 in a row 112 is operably connected to a row word line 106. The row word lines 106 are operably connected to the row driver circuitry 114 at a first end of the row word lines 106 (e.g., a beginning end or the end proximate to the row driver circuitry 114; hereinafter "proximate end"). In the illustrated embodiment, the row driver circuitry 114 includes, for each row 112, a NAND gate 202 operably connected to an inverter circuit 204. A first input of the NAND gate 202 receives the address signal on signal line 206 and the second input of the NAND gate 202 receives a clock (CLK) signal on signal line 208. The output of the NAND gate 202 is input into the inverter circuit 204. The output of the inverter circuit 204 is operably connected to a row word line 106.

Signal edge sharpener circuitry 210 is operably connected to a second end of the row word lines (an ending end or the end distal from the row driver circuitry 114; hereinafter "distal end"). In the illustrated embodiment, the signal edge sharpener circuitry 210 is implemented as an n-type transistor. One example of an n-type transistor is an NMOS transistor, although embodiments are not limited to this type of transistor. The drain terminal of each NMOS transistor is operably connected to the word line and the source terminal is operably connected to a reference voltage (e.g., ground).

A delay circuit 212 is operably connected to each of the signal edge sharpener circuitry 210. In particular, an input of the delay circuit 212 is operably connected to the clock (CLK) signal line 208 and an output of the delay circuit 212 is operably connected to the inputs of the signal edge sharpener circuitry 210 (e.g., the gates of the n-type transistors). The output from the delay circuit 212 on signal line 214 is used to turn on and turn off the signal edge sharpener circuitry 210 (e.g., the n-type transistors).

In the embodiment shown in FIG. 2, the delay circuit 212 is implemented as an inverter circuit, although other embodiments are not limited to an inverter circuit. Thus, the signal output by the delay circuit 212 is an inverted clock signal. When the clock signal is at a high level, the signal on the signal line 212 is at a low level. When the clock signal is at a low level, the signal on the signal line 212 is at a high level. Since the signal edge sharpener circuitry 210 (e.g., the n-type transistors) turn on when a signal applied to the gate is at a high level, the n-type transistors turn on when the clock signal on signal line 208 transitions to a low signal level. Additionally, when the clock signal transitions to a low level, the signal on the word line 106 transitions to a low level. Turning on the n-type transistors when the signal on the word line 106 transitions to a low level pulls down the falling edge of the signal on the word line 106.

In some embodiments, one or more load circuits (represented by load circuit 216) are operably connected to the signal line 214. One example of a load circuit 216 is an n-type transistor, such as an NMOS transistor. The load circuits 216 are used to substantially match the load on the signal line 214 to the load on the word lines 106. The turning on and the turning off of the signal edge sharpener circuitry 210 is better matched to the start of the falling edge of the signal on the word line 106 when the load on the signal line 214 substantially matches to the load on the word line 106.

Figure 3:
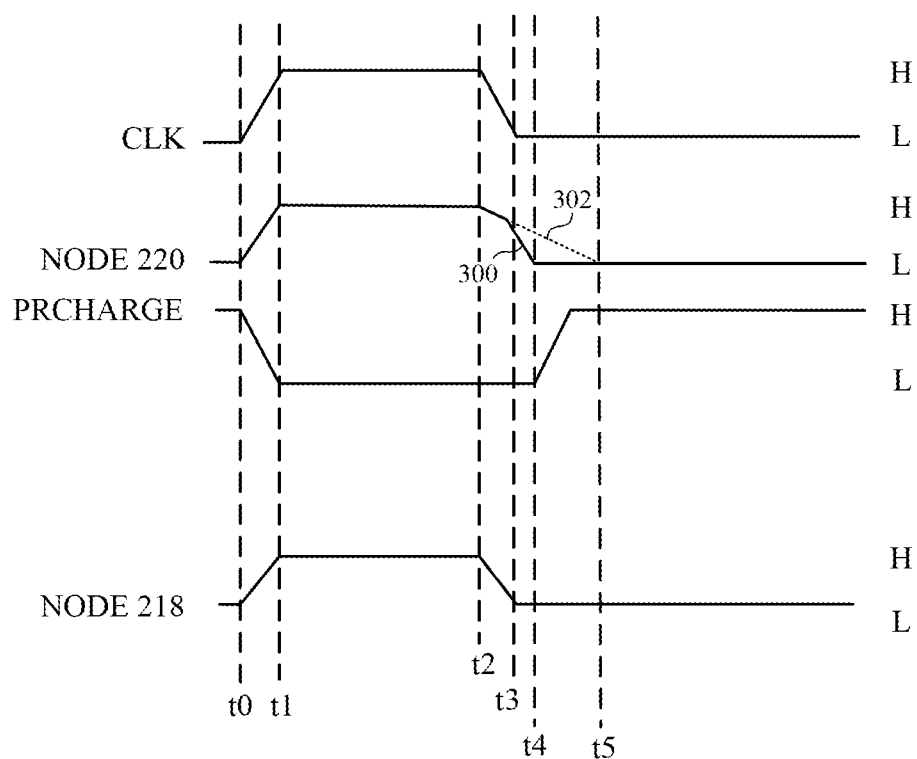
FIG. 3 illustrates an example timing diagram for the first example memory array shown in FIG. 2.

FIG. 3 illustrates an example timing diagram for the first example memory array shown in FIG. 2. As will be described, the signal edge sharpener circuitry (e.g., 210 in FIG. 2) pull downs the falling edge of a signal on a word line. The operation of the signal edge sharpener circuitry is described with respect to a signal on the word line at nodes 218 and 220 (shown in FIG. 2). The node 218 is located at the proximate end of the word line and the node 220 is positioned at the distal end of the word line.

At time t0, a precharge operation ends, as represented by the precharge signal beginning to transition from a high level to a low level. Additionally, the clock signal (CLK) and the signal on the word line at nodes 218, 220 begin to transition from a low level to a high level. At time t1, the signal on the word line at the nodes 218, 220 and the CLK signal are at the high level and the precharge signal is at a low level. At this point, a read or a write operation on a memory cell operably connected to the word line can be performed.

When the word line is to be deactivated, the CLK signal and the signal on the word line (see nodes 218, 220) begin to transition from the high level to the low level (time t2). Because the signal edge sharpener circuitry is activated when the CLK signal is at a low level, the signal level at node 220 is pulled down to the low level (see time t3 and region 300). Thus, the negative slope of the falling edge of the signal on the word line is increased and the signal reaches the low level faster than the signal would without the signal edge sharpener circuitry. Because the signal on the word line is at the low level at time t4, a precharge operation can start. Accordingly, the precharge signal begins to transition from the low level to the high level at time t4.

In the illustrated embodiment, the signal at node 220 would reach the low level at time t5 without the signal edge sharpener circuitry (see dashed line 302). The time difference between time t4 and time t5 represents a reduction in the amount of time the word line is asserted and a reduction in the amount of time between precharge operations.

Figure 4:
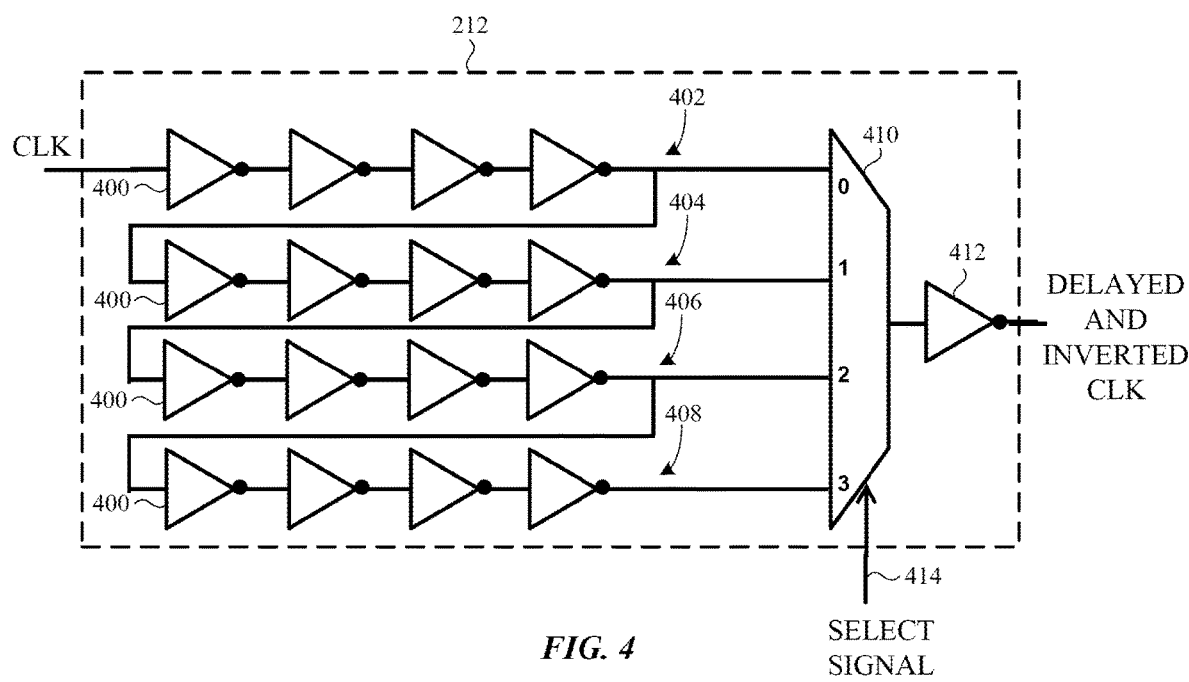
FIG. 4 depicts a schematic of an example alternate delay circuit suitable for use in the embodiment shown in FIG. 2.

FIG. 4 depicts a schematic of an example alternate delay circuit suitable for use in the embodiment shown in FIG. 2. The alternate delay circuit 212 enables a programmable or customizable delay. The representative delay circuit 212 shows sixteen inverter circuits 400 connected in series. Other embodiments can include any number of inverter circuits 400. Additionally, the sets 402, 404, 406, 408 of inverter circuits 400 can each include any number of inverter circuits 400. The sets 402, 404, 406, 408 can have the same number of inverter circuits 400 or at least one set 402, 404, 406, 408 can include a number of inverter circuits 400 that differs from another set.

The delay circuit 212 includes a first set 402 of inverter circuits 400 operably connected in series, a second set 404 of inverter circuits 400 operably connected in series, a third set 406 of inverter circuits 400 operably connected in series, and a fourth set 408 of inverter circuits 400 operably connected in series. Additionally, the first set 402, the second set 404, the third set 406, and the fourth set 408 are connected in series.

The CLK signal is input into the first set 402 of inverter circuits 400. The output of the first set 400 is operably connected to a first input of a select circuit 410. The output of the second set 404 of is operably connected to a second input of the select circuit 410. The output of the third set 406 is operably connected to the third input of the select circuit 410. The output of the fourth set 408 is operably connected to the fourth input of the select circuit 410. The output of the select circuit 410 is input into an inverter 412. A non-limiting example of the select circuit 410 is a multiplexer.

A select signal on signal line 414 selects one of the inputs to be the output of the select circuit 410. When the select signal selects the first input, the CLK signal propagates through the first set 402 of inverter circuits 400 and the output of the first set 402 is output from the select circuit 410. The CLK signal is delayed by each inverter circuit 400 in the first set 400. A delayed and inverted CLK signal is output from the inverter circuit 412.

When the select signal selects the second input, the CLK signal propagates through the first set 402 and the second set 404 of inverter circuits 400. The output of the second set 404 is output from the select circuit 410. Thus, the CLK signal is delayed by each inverter circuit 400 in the first set 400 and in the second set 404 of inverter circuits 400. A delayed and inverted CLK signal is output from the inverter circuit 412.

When the select signal selects the third input, the CLK signal propagates through the first set 402, the second set 404, and the third set 406 of inverter circuits 400. The output of the third set 406 is output from the select circuit 410. The CLK signal is delayed by each inverter circuit 400 in the first set 400, the second set 404, and the third set 406 of inverter circuits 400. A delayed and inverted CLK signal is output from the inverter circuit 412.

When the select signal selects the fourth input, the CLK signal propagates through the first set 402, the second set 404, the third set 406, and the fourth set 408 of inverter circuits 400. The output of the fourth set 408 is output from the select circuit 410. Thus, the CLK signal is delayed by each inverter circuit 400 in the first set 400, the second set 404, the third set 406, and the fourth set 408 of inverter circuits 400. A delayed and inverted CLK signal is output from the inverter circuit 412.

Figure 5:
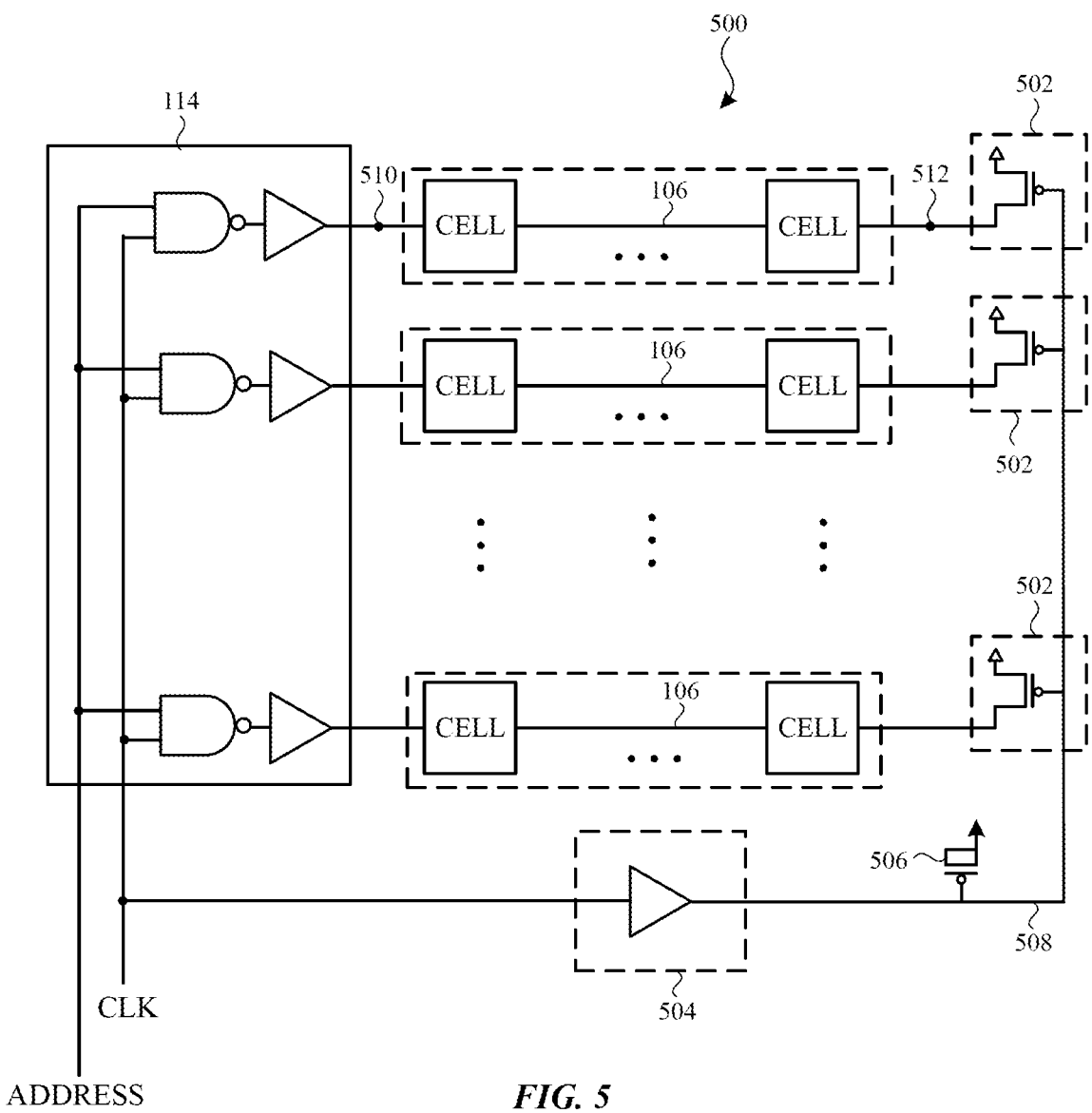
FIG. 5 illustrates a block diagram of a second example memory array with signal edge sharpener circuitry in accordance with some embodiments.

FIG. 5 illustrates a block diagram of a second example memory array with signal edge sharpener circuitry in accordance with some embodiments. The memory array 500 is similar to the memory array 200 shown in FIG. 2 except for the signal edge sharpener circuitry 502, the delay circuit 504, and the one or more load circuits (represented by load circuit 506). The embodiment shown in FIG. 5 is configured to pull up the rising edge of a signal on one or more asserted word lines.

In the illustrated embodiment, the signal edge sharpener circuitry 502 is implemented as a p-type transistor. One example of a p-type transistor is a PMOS transistor, although embodiments are not limited to this type of p-type transistor. The source terminal of each PMOS transistor is operably connected to the word line and the drain terminal is operably connected to a reference voltage.

The delay circuit 504 is operably connected to each of the signal edge sharpener circuitry 502. In particular, an input of the delay circuit 504 is operably connected to the clock (CLK) signal line 208 and an output of the delay circuit 504 is operably connected to the inputs of the signal edge sharpener circuitry 502 (e.g., the gates of the p-type transistors). The output from the delay circuit 504 on signal line 508 is used to turn on and turn off the signal edge sharpener circuitry 502 (e.g., the p-type transistors).

In the embodiment shown in FIG. 5, the delay circuit 504 is implemented as a buffer circuit, although other embodiments are not limited to this configuration. Thus, the signal output by the delay circuit 504 is a delayed clock signal. When the clock signal is at a high level, the signal on the signal line 508 is at a high level. When the clock signal is at a low level, the signal on the signal line 508 is at a low level. Since the signal edge sharpener circuitry 502 (e.g., the p-type transistors) turn on when a signal applied to the gate is at a low level, the p-type transistors turn on when the clock signal on signal line 208 transitions to a low signal level. Additionally, when the clock signal transitions to a high level, the signal on the word line 106 transitions to a high level. Turning on the p-type transistors when the signal on the word line 106 transitions to a level pulls up the rising edge of the signal on the word line 106.

In some embodiments, the load circuit 506 is operably connected to the signal line 508. One example of a load circuit 506 is a p-type transistor, such as a PMOS transistor. The gate of the p-type transistor is operably connected to the signal line 508. The load circuit 506 is used to substantially match the load on the signal line 508 to the load on the word lines 106. The turning on and the turning off of the signal edge sharpener circuitry 502 is better matched to the start of the rising edge of the signal on the word line 106 when the load on the signal line 508 substantially matches to the load on the word line 106.

Figure 6:
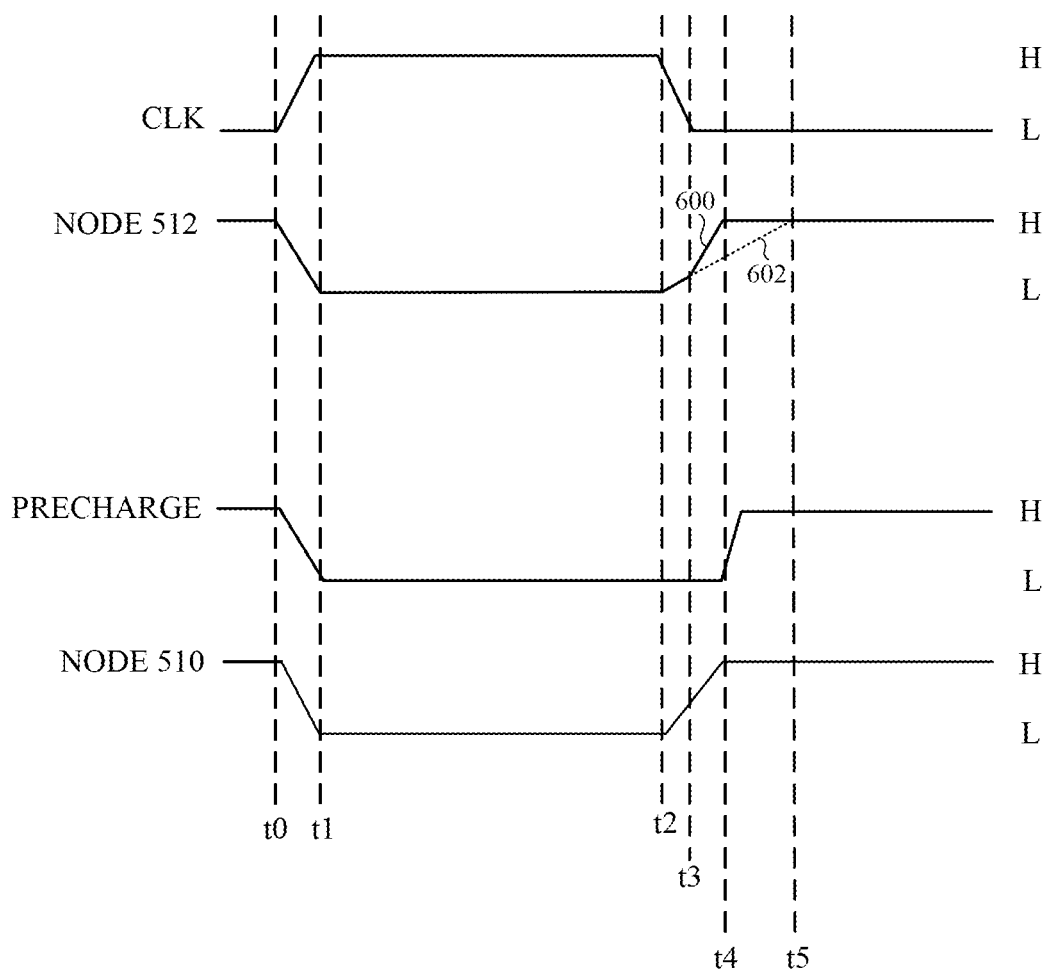
FIG. 6 depicts an example timing diagram for the second example memory array shown in FIG. 5.

FIG. 6 depicts an example timing diagram for the second example memory array shown in FIG. 5. As will be described, the signal edge sharpener circuitry (e.g., 502 in FIG. 5) pulls up the rising edge of a signal on a word line. The operation of the signal edge sharpener circuitry is described with respect to a signal on the word line at nodes 510 and 512 (shown in FIG. 5). The node 510 is located at the proximate end of the word line and the node 512 is positioned at the distal end of the word line.

At time t0, the precharge signals on the bit lines begin to transition from the high level to the low level, indicating the end of a precharge operation. Additionally, the CLK signal begins to transition to a high level and the signal on the word line at nodes 510, 512 begins to transition from a high level to a low level. At time t1, the CLK signal is at a high level and the signal on the word line (see nodes 510, 512) is at a low level. At this point, a read or a write operation on a memory cell operably connected to the word line can be performed.

When the word line is to be deactivated, the CLK signal begins to transition from a high level to a low level and the signal on the word line (see nodes 510, 512) begins to transition from the low level to a high level (time t2). Because the signal edge sharpener circuitry is activated when the CLK signal is at a low level (time t3), the signal level at node 512 is pulled up to the high level at time t4 (see region 600). Thus, the positive slope of the rising edge of the signal on the word line is increased and the signal reaches the high level faster than the signal would without the signal edge sharpener circuitry. Because the signal on the word line is at the high level at time t4, a precharge operation can start. Accordingly, the precharge signal begins to transition from the low level to the high level at time t4.

In the illustrated embodiment, the signal at node 512 would reach the high level at time t5 without the signal edge sharpener circuitry (see dashed line 602). The time difference between time t4 and time t5 represents a reduction in the amount of time the word line is asserted and a reduction in the amount of time between precharge operations.

Figure 7:
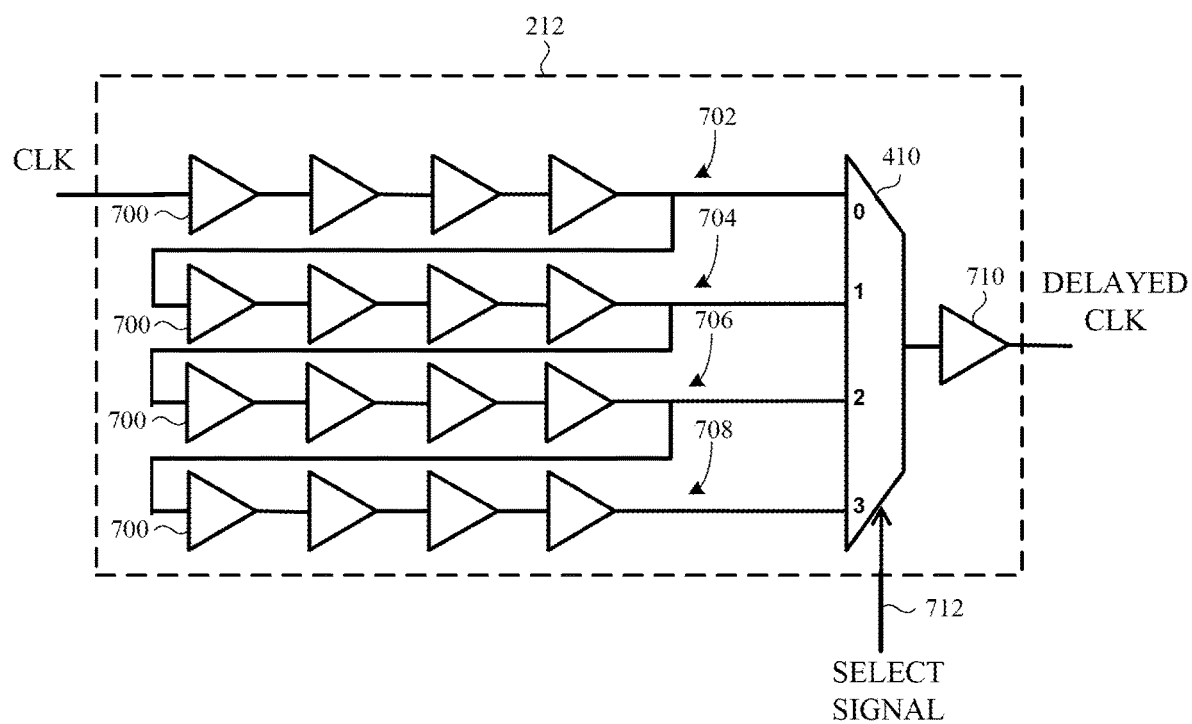
FIG. 7 illustrates a schematic of an example alternate delay circuit suitable for use in the embodiment shown in FIG. 5.

FIG. 7 illustrates an alternate delay circuit 504 for the second example memory array shown in FIG. 5. The alternate delay circuit 504 enables a programmable or customizable delay. The alternate delay circuit 504 is similar to the alternate delay circuit 212 shown in FIG. 4 except that buffer circuits 700 are used instead of inverter circuits. The representative delay circuit 504 shows sixteen buffer circuits 700 connected in series. Other embodiments can include any number of buffer circuits 700. Additionally, the sets 702, 704, 706, 708 of buffer circuits 700 can each include any number of buffer circuits 700. The sets 702, 704, 706, 708 can have the same number of buffer circuits 700 or at least one set 702, 704, 706, 708 can include a number of buffer circuits 700 that differs from another set.

The delay circuit 504 includes a first set 702 of buffer circuits 700 operably connected in series, a second set 704 of buffer circuits 700 operably connected in series, a third set 706 of buffer circuits 700 operably connected in series, and a fourth set 708 of buffer circuits 700 operably connected in series. Additionally, the first set 702, the second set 704, the third set 706, and the fourth set 708 are connected in series.

The CLK signal is input into the first set 702 of buffer circuits 700. The output of the first set 702 is operably connected to a first input of a select circuit 410. The output of the second set 704 of buffer circuits 700 is operably connected to a second input of the select circuit 410. The output of the third set 706 of buffer circuits 700 is operably connected to the third input of the select circuit 410. The output of the fourth set 708 of the buffer circuits 700 is operably connected to the fourth input of the select circuit 410. The output of the select circuit 410 is input into a buffer circuit 710.

A select signal on signal line 712 selects one of the inputs to be the output of the select circuit 410. When the select signal selects the first input, the CLK signal propagates through the first set 702 of buffer circuits 700 and the output of the first set 702 is output from the select circuit 410. The CLK signal is delayed by each buffer circuit 700 in the first set 702 of buffer circuits 700. A delayed CLK signal is output from the buffer circuit 710.

When the select signal selects the second input, the CLK signal propagates through the first set 702 and the second set 704 of buffer circuits 700. The output of the second set 704 is output from the select circuit 410. Thus, the CLK signal is delayed by each buffer circuit 700 in the first set 702 and in the second set 704. A delayed CLK signal is output from the buffer circuit 710.

When the select signal selects the third input, the CLK signal propagates through the first set 702, the second set 704, and the third set 706 of buffer circuits 700. The output of the third set 706 is output from the select circuit 410. The CLK signal is delayed by each buffer circuit 700 in the first set 702, the second set 704, and in the third set 706 of buffer circuits 700. A delayed CLK signal is output from the buffer circuit 710.

When the select signal selects the fourth input, the CLK signal propagates through the first set 702, the second set 704, the third set 706, and the fourth set 708 of buffer circuits 700. The output of the fourth set 708 is output from the select circuit 410. Thus, the CLK signal is delayed by each buffer circuit 700 in the first set 702, the second set 704, the third set 706, and the fourth set 708 of buffer circuits 700. A delayed CLK signal is output from the buffer circuit 710.

Figure 8:
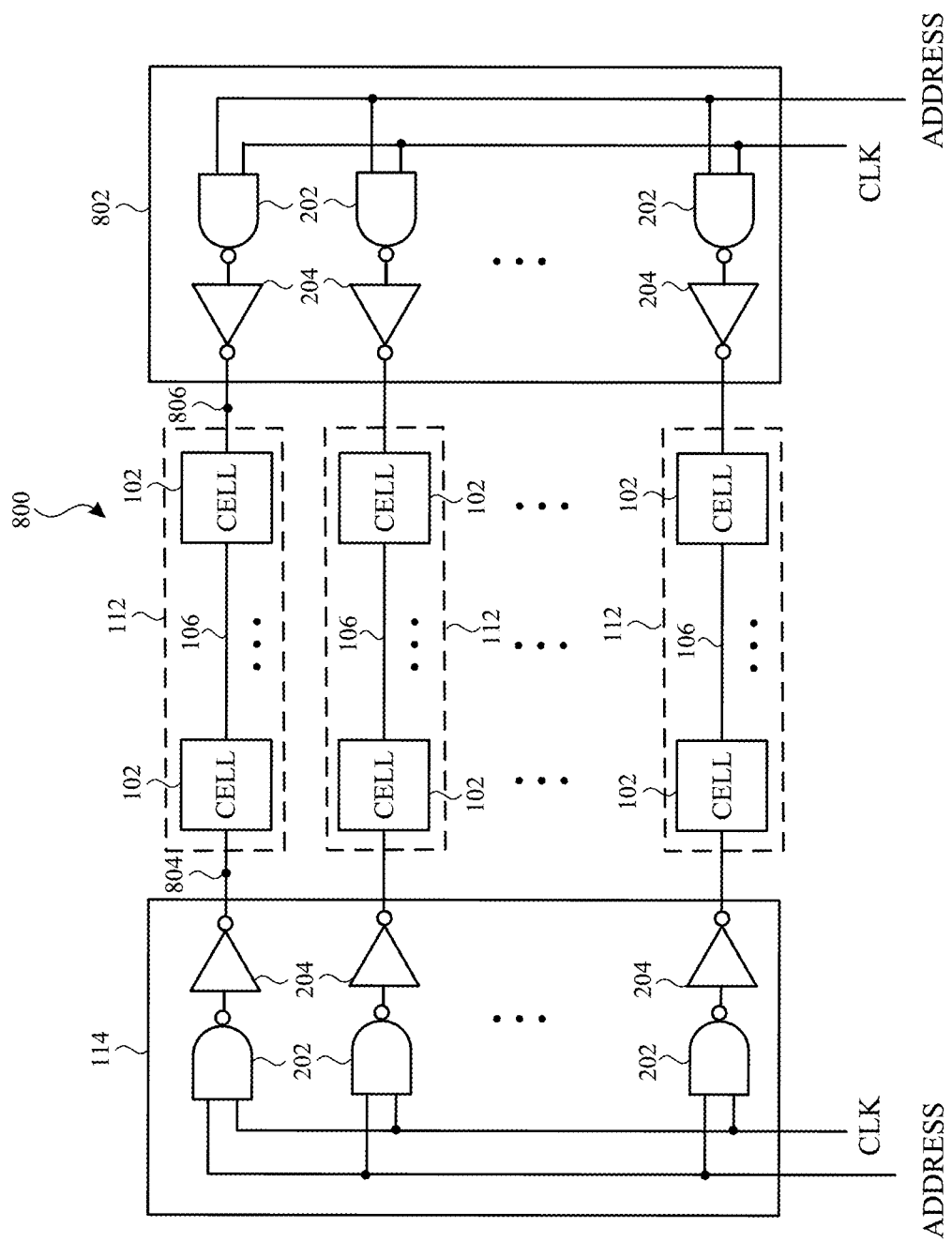
FIG. 8 depicts a block diagram of a third example memory array with signal edge sharpener circuitry in accordance with some embodiments.

FIG. 8 depicts a block diagram of a third example memory array with signal edge sharpener circuitry in accordance with some embodiments. The memory array 800 is similar to the memory array 200 shown in FIG. 2 except for the signal edge sharpener circuitry 802. The embodiment shown in FIG. 8 is configured to pull up the rising edge of a signal on one or more asserted word lines and/or pull down the falling edge of a signal on one or more asserted word lines.

In the illustrated embodiment, the signal edge sharpener circuitry 802 is a second row driver circuitry that corresponds to the first row driver circuitry 114. The proximate ends of the word lines 106 are operably connected to the first row driver circuitry 114 and the distal ends of the word lines 106 are operably connected to the second row driver circuitry 804. The ADDRESS and CLK signals are received by both the first and the second row driver circuitries 114, 802.

Figure 9:
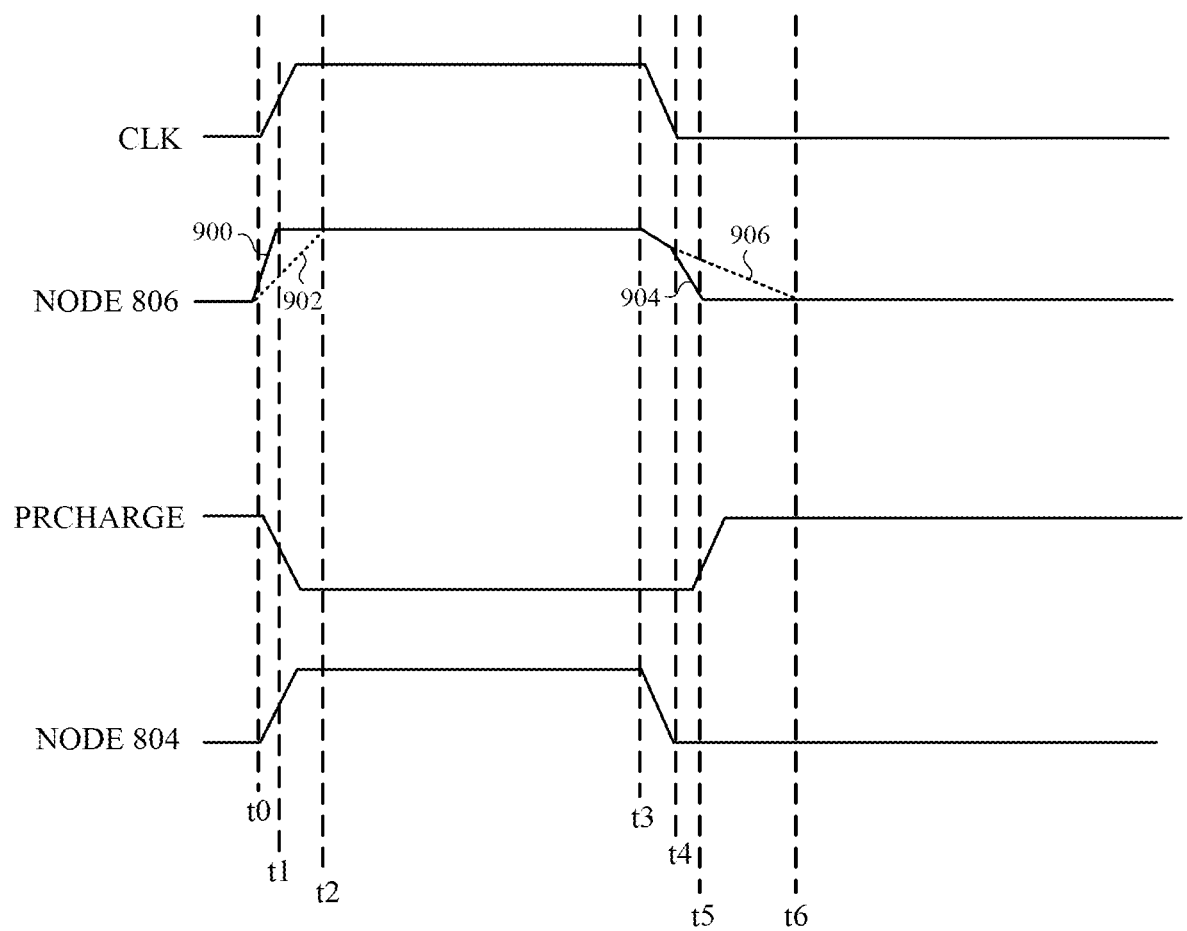
FIG. 9 illustrates an example timing diagram for the third example memory array shown in FIG. 8.

FIG. 9 illustrates an example timing diagram for the third example memory array shown in FIG. 8. The operation of the signal edge sharpener circuitry 802 is described with respect to a signal on the word line at nodes 804 and 806 (shown in FIG. 8). The node 804 is located at the proximate end of the word line and the node 806 is positioned at the distal end of the word line.

At time t0, the precharge signals on the bit lines begin to transition from the high level to the low level, indicating the end of a precharge operation. Additionally, the ADDRESS signal is received at the first row driver circuitry 114 and at the signal edge sharpener circuit 802 (not shown), and the CLK signal begins to transition from a low level to a high level. Because both the ADDRESS and the CLK signals are transitioning to a high level, both the first and the second row driver circuitries cause the signal on the word line (see nodes 510, 512) to transition from a low level to a high level. The first and the second row driver circuitries apply the signal on the word line from both the proximate end and the distal end of the word line. Thus, the positive slope of the rising edge of the signal on the word line is increased (see region 900) and the signal reaches the high level faster than the signal would without the signal edge sharpener circuitry (e.g., the second row driver circuitry) (see time t1). In the illustrated embodiment, the signal at node 806 would reach the high level at time t2 without the signal edge sharpener circuitry (see dashed line 902).

When the word line is to be deactivated, the CLK signal begins to transition from a high level to a low level and the signal on the word line (see nodes 804, 806) begins to transition from the high level to a low level (time t3). Because the signal output by the signal edge sharpener circuitry (e.g., second row driver circuitry 802) is beginning to transition to a low level, the signal level at node 806 is pulled down to the low level between times t4 and t5 (see region 904). Thus, the negative slope of the falling edge of the signal on the word line is increased and the signal reaches the low level faster than the signal would without the signal edge sharpener circuitry. In FIG. 9, the signal at node 806 would reach the low level at time t6 without the signal edge sharpener circuitry (see dashed line 906).

Because the signal on the word line is at the low level at time t5, a precharge operation can start. Accordingly, the precharge signal begins to transition from the low level to the high level at time t5.

Figure 10:
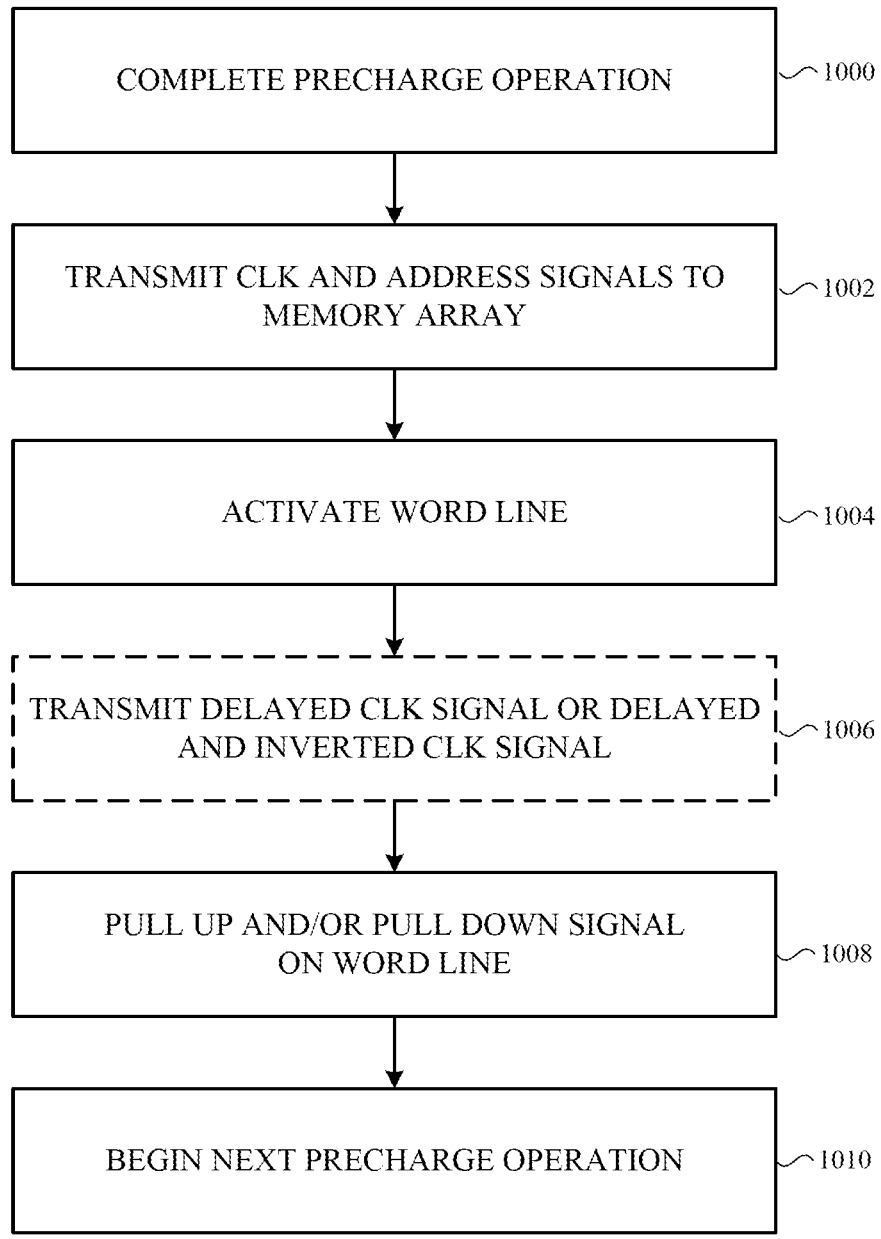
FIG. 10 depicts a flowchart of operating a memory array with signal edge sharpener circuitry in accordance with some embodiments.

FIG. 10 depicts a flowchart of operating a memory array with signal edge sharpener circuitry in accordance with some embodiments. Initially, a precharge operation is completed and the CLK and ADDRESS signals are transmitted to the memory array and received by the row driver circuitry (blocks 1000, 1002). A word line is then activated at block 1004.

Next, as shown in block 1006, a delayed and inverted CLK signal (see FIG. 2) or a delayed clock signal (see FIG. 5) is transmitted to the respective signal edge sharpener circuitry to turn on the respective signal edge sharpener circuitry. As described previously, in the embodiment shown in FIG. 2, the signal edge sharpener circuitry is an n-type transistor and the delayed and inverted CLK signal turns on the n-type transistors, which in turn pulls down the falling edge of the signal on the word line. Alternatively, in the embodiment shown in FIG. 5, the signal edge sharpener circuitry is a p-type transistor and the delayed CLK signal turns on the p-type transistors, which in turn pulls up the rising edge of the signal on the word line. Block 1006 is optional and is not included in the embodiment shown in FIG. 8.

The signal on the word line is then pulled up and/or pulled down at block 1008 to cause the signal to reach a respective signal level faster than the signal would reach without the signal edge sharpener circuitry. At block 1010, the next precharge operation is initiated.

Figure 11:
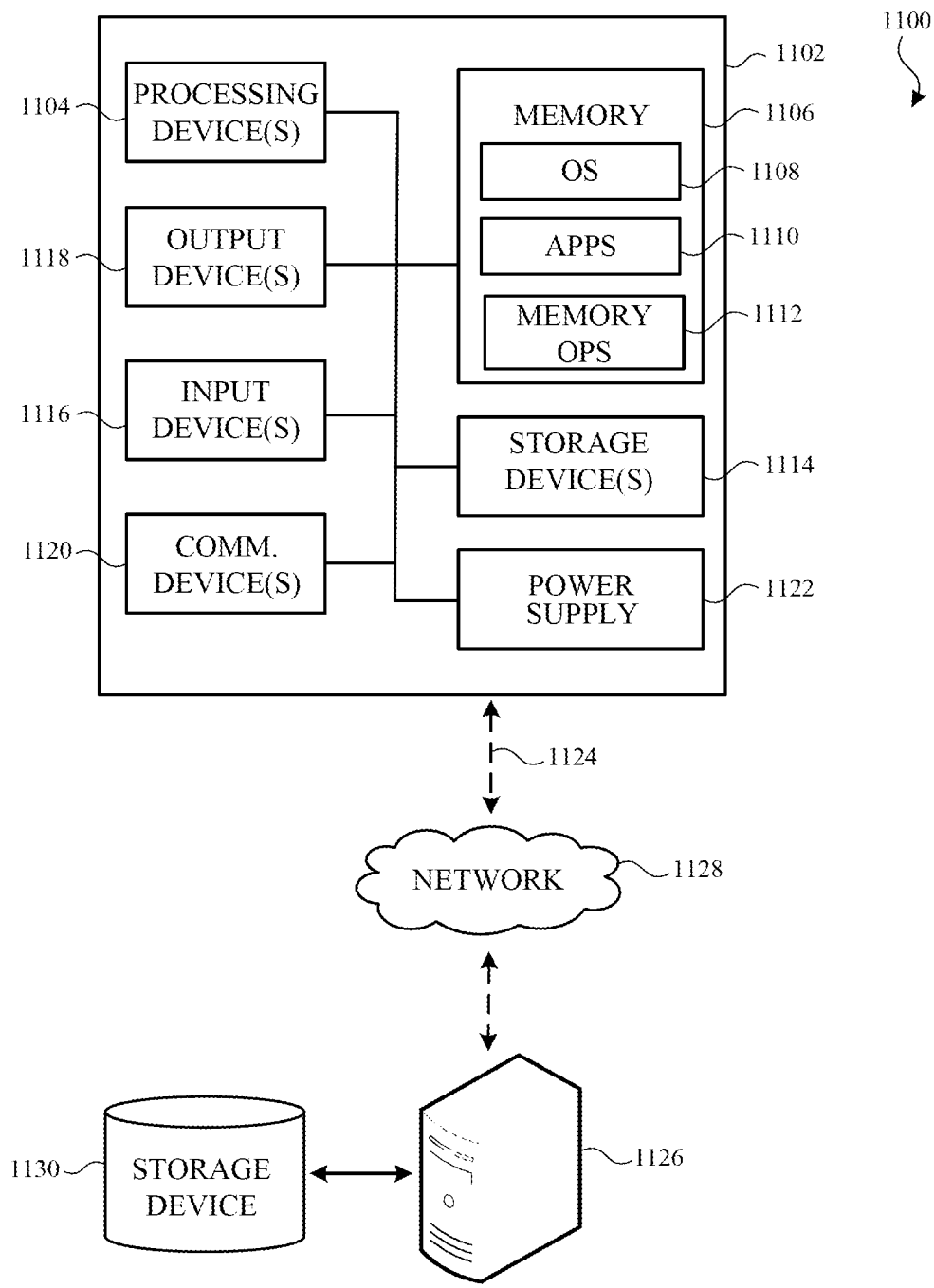
FIG. 11 illustrates an example system that can include one or more memory devices in accordance with some embodiments in accordance with some embodiments.

FIG. 11 depicts an example system that can include one or more memory devices in accordance with some embodiments. The system 1100 includes an electronic device 1102. In a basic configuration, the electronic device 1102 may include at least one processing device 1104 and a system memory device 1106. The system memory device 1106 may include a number of data files and executable instructions of program modules, such as executable instructions associated with an operating system (OS) 1108, one or more software programs (APPS) 1110 suitable for parsing received input, determining subject matter of received input, determining actions associated with the input and so on, and memory operations 1112 for performing some or all of the memory operations disclosed herein. In one embodiment, the storage device 1130 stores one or more select signals for the select circuit shown in FIGS. 4 and 7. When executed by the processing device(s) 1104, the executable instructions may perform and/or cause to be performed processes including, but not limited to, the aspects as described herein.

The OS 1108, for example, may be suitable for controlling the operation of the electronic device 1102. Furthermore, embodiments may be practiced in conjunction with a graphics library, other operating systems, or any other application program and is not limited to any particular application or system.

The electronic device 1102 may have additional features or functionality. For example, the electronic device 1102 may also include additional removable and/or non-removable data storage devices 1114 such as, for example, magnetic disks, optical disks, tape, and/or memory cards or sticks. The system memory device 1106 and/or the data storage device 1114 may be implemented as a memory device that precharges signal lines and selects a subset of the precharged signal lines to perform an operation (e.g., to access a memory cell or cells). For example, the system memory device 1106 and/or the data storage device 1114 can be an SRAM device.

The electronic device 1102 may also have one or more input devices 1116 and one or more output devices 1118. Example input device(s) 1116 include, but are not limited to, a keyboard, a trackpad, a mouse, a pen, a sound or voice input device, and/or a touch, force and/or swipe input device. The output device(s) 1118 can be one or more displays, one or more speakers, a printer, headphones, haptic or tactile feedback device, and the like. The electronic device 1102 may include one or more communication devices 1120 allowing communications with other electronic devices. Examples communication devices 1120 include, but are not limited to, radio frequency (RF) transmitter, receiver, and/or transceiver circuitry (e.g., WiFi), universal serial bus (USB), parallel and/or serial ports, cellular devices, near field communication devices, and short range wireless devices.

The electronic device 1102 further includes a power supply 1122, which may be implemented as an external power source, such as an AC adapter. Additionally or alternatively, the power supply 1122 may include one or more batteries or a powered docking cradle that supplements or recharges the batteries.

The system memory 1106 and the storage device(s) 1114 may include, but is not limited to, volatile storage (e.g., random access memory), non-volatile storage (e.g., read-only memory), flash memory, or any combination of such memories. For example, the system memory 1106 and the storage device(s) 1114 can each be RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the electronic device 1102. In some instances, any such memory or storage device may be part of the electronic device 1102 or operably connected to the electronic device 1102.

Furthermore, embodiments may be practiced in an electrical circuit comprising discrete electronic elements, packaged or integrated electronic chips containing logic gates, a circuit utilizing a microprocessor, or on a single chip containing electronic elements or microprocessors. For example, embodiments of the disclosure may be practiced via a system-on-a-chip (SOC) where each or many of the components illustrated in FIG. 11 may be integrated onto a single integrated circuit. Such an SOC device may include one or more processing devices, graphics units, communications units, system virtualization units and various application functionality all of which are integrated (or "burned") onto the chip substrate as a single integrated circuit.

When operating via an SOC, the functionality, described herein, with respect to memory operations, may be operated via application-specific logic integrated with other components of the electronic device 1102 on the single integrated circuit (chip). Embodiments of the disclosure may also be practiced using other technologies capable of performing logical operations such as, for example, AND, OR, and NOT, including but not limited to mechanical, optical, fluidic, and quantum technologies. In addition, embodiments may be practiced within a general purpose computer or in any other circuits or systems.

In some embodiments, the electronic device 1102 optionally accesses (optional connection and access indicated by dashed line 1124) one or more server-computing devices (represented by server-computing device 1126) through a wired and/or wireless connection to one or more networks (represented by network 1128). The server-computing device 1126 can interact with various programs or services stored on one or more storage devices (represented by storage device 1130) and executed by the server-computing device 1126. In one embodiment, the storage device 1130 stores one or more select signals for the select circuit shown in FIGS. 4 and 7.

In one or more embodiments, the network 1128 is illustrative of any type of network, for example, an intranet and/or a distributed computing network (e.g., the Internet). The electronic device 1102 can be a personal or handheld computing device or a desktop computing device. For example, the electronic device 1102 may be a smart phone, a tablet, a wearable device, a desktop computer, a laptop computer, and/or a server (individually or in combination). This list of electronic devices is for example purposes only and should not be considered as limiting. Any electronic device that provides and/or interacts with one or more modeling programs or services may be utilized.

Although the figures depict certain components, values, and signal levels, other embodiments are not limited to these components, values, and signal levels. For example, FIG. 2 depicts the signal edge sharpener circuitry as n-type transistors and FIG. 5 illustrates the signal edge sharpener circuitry as p-type transistors. Other embodiments can use a different type or types of components as the signal edge sharpener circuitry.

In one aspect, a memory device includes row driver circuitry operably connected to a memory array. The memory array includes memory cells arranged in rows and columns. A word line is operably connected to the memory cells in each row. A proximate end of each word line is operably connected to the row driver circuitry. Signal edge sharpener circuitry is operably connected to a distal end of each word line.

In another aspect an electronic device includes row driver circuitry operably connected to a memory array. The memory array includes memory cells arranged in rows and columns. A word line is operably connected to the memory cells in each row. A proximate end of each word line is operably connected to the row driver circuitry. Signal edge sharpener circuitry is operably connected to a distal end of each word line. A delay circuit is operably connected to the signal edge sharpener circuitry, In yet another aspect, a method of operating a memory device includes activating a word line based on a received clock signal and a received address signal. A delayed clock signal is transmitted to a first signal edge sharpener circuitry operably connected to the word line and a rising edge of a signal on the word line is responsively pulled up, and/or a delayed and inverted clock signal is transmitted to a second signal edge sharpener circuitry operably connected to the word line and a falling edge of the signal on the word line is responsively pulled down. When the signal on the word line is pulled up or pulled down, a precharge operation on at least one bit line in the memory device begins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    transmitting a clock signal to a row driver circuit and to a delay circuit;
    deactivating a word line based on the clock signal received by the row driver circuit, the word line operably connected to a memory cell;
    transmitting a delayed clock signal output by the delay circuit to a control terminal of signal edge sharpener circuitry operably connected to a distal end of the word line;
    based on the delayed clock signal, causing, by the signal edge sharpener circuitry, a rising edge of a word line signal on the word line to be pulled up at an increased rate; and
    initiating a precharge operation on a bit line in response to the rising edge of the word line signal on the word line being pulled up to a predetermined level.

2. The method of claim 1, further comprising activating the word line when the precharge operation is completed.

3. The method of claim 1, wherein the signal edge sharpener circuitry comprises a p-type transistor.

4. The method of claim 1, wherein the memory cell is a static random access memory cell.

5. A memory device, comprising:
    a memory cell;
    a word line operably connected to the memory cell;
    a delay circuit configured to receive a clock signal and to output a delayed clock signal; and
    signal edge sharpener circuitry operably connected to a distal end of the word line and to the delay circuit, the signal edge sharpener circuitry having a control terminal configured to receive the delayed clock signal from the delay circuit and responsively pull up a rising edge of a word line signal on the word line at an increased rate.

6. The memory device of claim 5, wherein:
    the signal edge sharpener circuitry comprises a p-type transistor; and
    the delay circuit comprises a buffer circuit operably connected to a gate of the p-type transistor.

7. The memory device of claim 5, further comprising a load circuit operably connected to an output of the delay circuit.

8. The memory device of claim 7, wherein the load circuit comprises a p-type transistor, the gate of the p-type transistor operably connected to the output of the delay circuit.

9. The memory device of claim 5, wherein:
    the signal edge sharpener circuitry comprises a p-type transistor; and
    the delay circuit comprises:
        a select circuit operably connected to a gate of the p-type transistor;
        a first plurality of buffer circuits connected in series, wherein a first output of the first plurality of buffer circuits is operably connected to a first input of the select circuit; and
        a second plurality of buffer circuits connected in series, wherein a second output of the second plurality of buffer circuits is operably connected to a second input of the select circuit and the first output of the first plurality of buffer circuits is operably connected to an input of the second plurality of buffer circuits,
        wherein the select circuit is operable to receive a select signal and based on the select signal, output either the first output or the second output.

10. The memory device of claim 5, further comprising row driver circuitry operably connected to the word line.

11. The memory device of claim 10, wherein:
    the row driver circuitry comprises first row driver circuitry; and
    the signal edge sharpener circuitry comprises second row driver circuitry.

12. The memory device of claim 5, wherein the memory device is a static random access memory device.

13. A system, comprising:
    a processing device; and
    a memory device operably connected to the processing device, the memory device comprising:
        a memory cell;
        a word line operably connected to the memory cell, wherein a proximate end of the word line is operably connected to row driver circuitry;
        a delay circuit configured to receive a clock signal and output a delayed clock signal;
        signal edge sharpener circuitry operably connected between a distal end of the word line and an output of the delay circuit, the signal edge sharpener circuitry having a control terminal configured to receive the delayed clock signal and responsively pull up a rising edge of a word line signal on the word line at an increased rate; and
        a load circuit operably connected to the output of the delay circuit.

14. The system of claim 13, wherein
the memory cell is included in an array of memory cells in a memory array; and
the memory device further comprises precharge circuitry operably connected between the processing device and the memory array.

15. The system of claim 13, wherein:
the signal edge sharpener circuitry comprises a p-type transistor; and
the delay circuit comprises a buffer circuit operably connected to a gate of the p-type transistor.

16. The system of claim 13, wherein:
the row driver circuitry comprises a NAND gate operably connected to an inverter circuit;
a first input of the NAND gate is configured to receive an address signal and a second input of the NAND gate is configured to receive a clock signal;
an output of NAND gate is operably connected to an input of the inverter; and
an output of the inverter is operably connected to the word line.

17. The system of claim 13, wherein the load circuit comprises a p-type transistor and a gate of the p-type transistor is operably connected to the output of the delay circuit.

18. The system of claim 13, wherein:
the signal edge sharpener circuitry comprises a p-type transistor; and
the delay circuit comprises:
a select circuit operably connected to a gate of the p-type transistor;
a first plurality of buffer circuits connected in series, wherein a first output of the first plurality of buffer circuits is operably connected to a first input of the select circuit; and
a second plurality of buffer circuits connected in series, wherein a second output of the second plurality of buffer circuits is operably connected to a second input of the select circuit and the first output of the first plurality of buffer circuits is operably connected to an input of the second plurality of buffer circuits,
wherein the select circuit is operable to receive a select signal and based on the select signal, output either the first output or the second output.

19. The system of claim 13, further comprising one or more of:
a communication device operably connected to the processing device;
an input device operably connected to the processing device;
an output device operably connected to the processing device; or
a power supply operably connected to the processing device.

20. The system of claim 13, wherein the memory cell is a static random access memory cell.

* * * * *